United States Patent

Conboy et al.

Patent Number: 6,157,866
Date of Patent: *Dec. 5, 2000

[54] AUTOMATED MATERIAL HANDLING SYSTEM FOR A MANUFACTURING FACILITY DIVIDED INTO SEPARATE FABRICATION AREAS

[75] Inventors: Michael R. Conboy; Danny C. Shedd; Elfido Coss, Jr., all of Austin, Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/878,787

[22] Filed: Jun. 19, 1997

[51] Int. Cl.[7] ................................................ G06F 19/00

[52] U.S. Cl. .......................... 700/121; 700/112; 700/97; 700/115; 700/116; 700/113; 414/940

[58] Field of Search ...................... 700/121, 112, 700/99, 95, 97, 115, 118, 113; 414/217, 939, 940

[56] References Cited

U.S. PATENT DOCUMENTS

| | | | |
|---|---|---|---|
| 4,034,339 | 7/1977 | Free et al. | 340/146.1 C |
| 4,457,661 | 7/1984 | Flint et al. | 414/404 |
| 4,534,389 | 8/1985 | Tullis | 141/98 |
| 4,588,343 | 5/1986 | Garrett | 414/221 |
| 4,744,715 | 5/1988 | Kawabata | 414/331 |
| 4,776,744 | 10/1988 | Stonestreet et al. | 414/217 |
| 4,816,098 | 3/1989 | Davis et al. | 156/345 |
| 4,875,989 | 10/1989 | Davis et al. | 204/298 |
| 4,906,328 | 3/1990 | Freeman et al. | 156/643 |
| 4,923,352 | 5/1990 | Tamura et al. | 414/225 |
| 4,962,726 | 10/1990 | Matsushita et al. | 118/719 |
| 4,964,776 | 10/1990 | Wakita et al. | 414/277 |
| 4,980,971 | 1/1991 | Bartschat et al. | 29/833 |
| 5,024,570 | 6/1991 | Kiriseko et al. | 414/222 |

(List continued on next page.)

FOREIGN PATENT DOCUMENTS

| | | |
|---|---|---|
| 0 552 756 A1 | 7/1993 | European Pat. Off. . |
| 48442 | 2/1989 | Japan . |
| 401064232 | 3/1989 | Japan . |
| 402082618 | 3/1990 | Japan . |
| 405175179 | 7/1993 | Japan . |
| 6-69312 | 3/1994 | Japan . |
| 6-104326 | 4/1994 | Japan . |

*Primary Examiner*—Paul P. Gordon
*Attorney, Agent, or Firm*—Conley, Rose & Tayon, PC; Robert C. Kowert

[57] ABSTRACT

An automated material handling system is presented for a manufacturing facility divided into separate fabrication areas. The automated material handling system plans and carries out the movement of work pieces between fabrication areas and maintains a database indicating the location of each work piece within the manufacturing facility. In one embodiment, the automated material handling system accomplishes the containerless transfer of semiconductor wafers through a wall separating a first and second fabrication areas. The wafers are transported within containers (e.g., wafer boats). The material handling system includes a number of transfer tools, including air lock chambers, mass transfer systems, robotic arms, and stock areas. The material handling system also includes a control system which governs the operations of the transfer tools as well as the dispersal of containers. The air lock chambers provide isolation between fabrication areas while permitting the transfer of wafers between the fabrication areas. A mass transfer system positioned within each air lock chamber allows for containerless transfer of wafers through the air lock chamber. The stock areas provide storage areas for containers adjacent to the air lock chambers. The robotic arms are used to move containers between the stock areas and the air lock chambers. The control system includes a main processor, a remote processor associated with each fabrication area, an internal network transmission medium coupling the main processor to the remote processors, and a cell network transmission medium within each fabrication area coupling the corresponding remote processor to one or more transfer tools.

43 Claims, 3 Drawing Sheets

U.S. PATENT DOCUMENTS

| | | | |
|---|---|---|---|
| 5,033,927 | 7/1991 | Pelissier | 414/217 |
| 5,084,959 | 2/1992 | Ando et al. | 29/740 |
| 5,105,368 | 4/1992 | Aletandersen et al. | 395/89 |
| 5,110,248 | 5/1992 | Asano et al. | 414/172 |
| 5,139,459 | 8/1992 | Takahashi et al. | 354/187 |
| 5,145,303 | 9/1992 | Clarke | 414/217 |
| 5,163,832 | 11/1992 | Ishii et al. | 432/244 |
| 5,193,969 | 3/1993 | Rush et al. | 414/404 |
| 5,216,804 | 6/1993 | Rosier et al. | 29/834 |
| 5,249,356 | 10/1993 | Okuda et al. | 29/833 |
| 5,299,901 | 4/1994 | Takayama | 414/404 |
| 5,303,214 | 4/1994 | Kulakowski et al. | 369/34 |
| 5,339,128 | 8/1994 | Tateyama et al. | 354/317 |
| 5,378,283 | 1/1995 | Ushikawa | 118/719 |
| 5,399,531 | 3/1995 | Wu | 437/205 |
| 5,451,131 | 9/1995 | Hecht et al. | 414/217 |
| 5,455,894 | 10/1995 | Conboy et al. | 395/82 |
| 5,505,577 | 4/1996 | Nishi | 414/417 |
| 5,527,390 | 6/1996 | Ono et al. | 118/719 |
| 5,544,421 | 8/1996 | Thompson et al. | 34/58 |
| 5,570,990 | 11/1996 | Bonora et al. | 414/543 |
| 5,658,123 | 8/1997 | Goff et al. | 414/786 |
| 5,664,925 | 9/1997 | Muka et al. | 414/217 |
| 5,730,573 | 3/1998 | Masujima et al. | 414/217 |
| 5,751,581 | 5/1998 | Tau et al. | 364/468.22 |
| 5,772,386 | 6/1998 | Mages et al. | 414/411 |
| 5,838,566 | 11/1998 | Conboy et al. | 364/468.22 |
| 5,924,833 | 7/1999 | Conboy et al. | 414/217 |

AUTOMATED MATERIAL HANDLING SYSTEM FOR A MANUFACTURING FACILITY DIVIDED INTO SEPARATE FABRICATION AREAS

BACKGROUND OF THE INVENTION

1. Field of the Invention

This invention relates to material handling systems and in particular to an automated system for the movement of work pieces within a manufacturing facility.

2. Description of the Relevant Art

Manufacturing facilities often employ material handling systems to move materials in various states of production (i.e., work pieces) between processing locations. Production states of work pieces vary from raw materials to finished products. Containers or carriers are commonly used to move the work pieces from one processing location to another during the manufacturing process. Typically, a transportation system is employed (e.g., a conveyor belt system) for moving the containers from one processing location to another within the system. Work pieces are typically placed into containers, and the work-piece-containing containers are transported between processing locations. Needed empty containers are generated as work pieces are removed from containers in order to be processed.

An example manufacturing facility is one which fabricates integrated circuits on semiconductor wafers. Such a facility typically includes a plurality of wafer fabrication process tools which perform various fabrication process steps upon groupings of semiconductor wafers called"lots". Each process tool typically has an accompanying stock area for storing containers of wafers waiting to be processed by the tool as well as wafers having already been processed by the tool. A common example of such a container is a wafer cassette or"boat" adapted for holding one or more semiconductor wafers.

Chemical mechanical polish (CMP) techniques are increasingly employed in the fabrication of integrated circuits. CMP techniques are used to planarize exposed upper surfaces of dielectric layers formed between layers of electrical conductors (i.e., interconnects). CMP combines chemical etching and mechanical buffing to remove raised features on the exposed upper surfaces. In a typical CMP process, a semiconductor wafer is mounted on a rotating holder and lowered onto a rotating surface flooded with a mild etchant solution, generally defined as a silica slurry. The etchant grows a thin layer on the exposed wafer surface that is almost simultaneously removed by the buffing action. The net effect is a very controlled polishing process capable of incredible flatness.

One problem with CMP techniques is that they produce large amounts of contaminants, including particulates, metallic ions, and chemical substances. The destructive effects of those contaminants is readily apparent in the overall performance of VLSI or ULSI devices. Any contaminants attributed to the slurry, chemical reactant, or buff/etch byproduct, which is thereafter introduced into other fabrication operations, severely compromises the success of those operations. For example, ingress of contaminants from the CMP operation to the thermal furnaces used for growing oxide, or to the chambers used for implanting ions, would negatively impact the resultant grown oxide or junction profile.

Without adequately preventing deposition of CMP-derived contaminants on semiconductor wafers undergoing other fabrication operations, CMP cannot be successfully employed. One way to minimize deposition of CMP-derived contaminants on semiconductor wafers undergoing other (i.e., non-CMP) fabrication operations would be to perform the CMP process in an area isolated (i.e., hermetically sealed) from other fabrication areas. Maintaining separate the CMP area from the other fabrication areas begins by installing a wall between those areas. Wafers must, however, be transported between the respective areas so that CMP can be incorporated within the process flow.

Transport of wafers between CMP and non-CMP areas entails passing the wafers through a door separating the areas. The door, depending upon sophistication, can be a load lock chamber adapted for passing a wafer-containing container. The wafer or wafers are transported in the container through the chamber from one area to another area. The load lock comprises an air circulation and filtration system which effectively flushes the ambient air surrounding the wafers. Unfortunately, however, the load lock by itself cannot in most instances remove contaminants from the surface of wafer-containing containers. The containers pick up contaminants while in the CMP fabrication area. When the containers passes through the load lock unit, those contaminants are not always flushed from the containers in the load lock. As a result, containers passed from one area to another may have contaminants clinging to them which may come loose and find their way onto the wafers.

It is therefore desirable to minimize the opportunity for a contaminated container to pass to and from a CMP area. An effective method of preventing passage of container entrained contaminants into what should be a "clean room" environment from a relatively dirty CMP room is to pass only the wafers through the wall and not the containers in which they reside. Such wafer transfer systems require coordinated efforts on both sides of the wall.

Robotic arms are now available which are able to accomplish many tedious and repetitive tasks previously performed by humans. Unlike a human, however, a robotic arm tirelessly performs such a task the same way every time, reducing variability in both the end result and the amount of time required to accomplish the task. The use of one or more robotic arms in a manufacturing process thus adds an element of predictability to the process.

Typically, if an empty container is not available when needed by a process tool, an empty container must be transported from another location in the system. Transportation of the empty container requires time, causing a delay in the processing of a wafer lot. Such time delays result in inefficient use of the process tool. The cumulative cost of such time delays may be substantial in a large semiconductor fabrication facility having several process tools which are costly to purchase, operate and maintain.

An obvious solution to the problem is to provide a relatively large number of empty containers in order to minimize the delay times. This solution may be prohibitive, however, both in terms of initial container costs and container storage costs. An increased number of empty containers requires more and/or larger stock areas for storage, and does not necessarily reduce the number of required container moves or increase production efficiency. Adequate distribution of the containers must be accomplished such that a sufficient number of empty containers are available when and where they are needed.

It is therefore desirable to have an automated material handling system for a manufacturing facility divided into separate fabrication areas. Such an automated material handling system would plan and carry out automated wafer transfer operations designed to pass only work pieces (e.g., semiconductor wafers) through walls separating fabrication areas, and not the containers used to hold the work pieces. Automating the wafer transfer operations would reduce the variability characteristic of manual operations. The desired automated material handling system would also manage the distribution of empty containers within the manufacturing system. Adequate distribution of empty containers would reduce the total number of empty containers required, reduce the number of required container moves within the system, reduce the required number and/or sizes of stock areas, and increase the overall production efficiency of the manufacturing system.

SUMMARY OF THE INVENTION

The problems outlined above are in large part solved by an automated material handling system for a manufacturing facility divided into separate fabrication areas. The automated material handling system plans and carries out the movement of work pieces between fabrication areas and maintains a database indicating the location of the work pieces within the manufacturing facility. In one embodiment, the automated material handling system accomplishes the containerless transfer of semiconductor wafers through a wall separating a first fabrication area and a second fabrication area. The semiconductor wafers are transported within containers (e.g., wafer cassettes or "boats"). The material handling system includes a number of transfer tools, including one or more air lock chambers, mass transfer systems, robotic arms, and stock areas. The material handling system also includes a control system which governs the operations of the transfer tools as well as the dispersal of containers within the manufacturing facility.

The air lock chambers are located within sealed openings in the wall, and provide isolation between the first and second fabrication areas while permitting the transfer of semiconductor wafers between the fabrication areas. A mass transfer system positioned within each air lock chamber allows for the containerless transfer of wafers through the air lock chamber. The stock areas provide storage areas for empty and wafer-containing containers adjacent to the air lock chambers. The robotic arms are used to move containers between the stock areas and the air lock chambers.

The control system includes a main processor, a remote processor associated with each fabrication area (i.e., cell), an internal network transmission medium which couples the main processor to the remote processors, and a cell network transmission medium within each fabrication area which couples the corresponding remote processor to one or more transfer tools. Each network transmission medium may be, for example, a multi-conductor cable, a coaxial cable, or a fiber-optic cable. The main processor receives messages from a host processor via an external network transmission medium. The main processor produces one or more transfer commands in response to each message directing a wafer transfer operation, and transmits the transfer commands upon the internal network transmission medium. Each transfer command directs an activity associated with the movement of one or more work pieces (e.g., semiconductor wafers) from the first fabrication area to the second fabrication area.

The remote processors receive transfer commands via the internal network transmission medium. Each remote processor addressed by a transfer command produces one or more control signals in response to the transfer command, and transmits the control signals upon the associated cell network transmission medium. One or more transfer tools receive control signals via the cell network transmission medium. Each transfer tool addressed by a control signal carries out one or more predefined transfer activities in response to the control signal. The end result of the coordinated actions of the transfer tools is movement of one or more work pieces from the first fabrication area to the second fabrication area.

A The main processor maintains a database which includes entries for each production unit (i.e., individual work piece or grouping of work pieces). Associated with each production unit is a location database entry indicating the fabrication area in which the production unit is currently located. Following the transfer of a production unit from one fabrication area to another, the main processor updates the location database entry associated with the production unit to indicate the fabrication area in which the production unit is currently located. Each remote processor maintains a database which includes the operational status of all transfer tools controlled by the remote processor.

The remote processors taking part in a transfer operation preferably plan the portions of the transfer operation involving the transfer tools located within the corresponding fabrication areas. During such planning, the remote processors take into consideration, for example, the distance associated with each possible route, the amount of time required to complete the transfer along each possible route, and the utilization history of each transfer tool which may be involved in the transfer. Weighing all such factors, the remote processors select the transfer tools which will participate in the transfer operation.

The main processor also governs the dispersal of empty and non-empty containers within each fabrication area and among all of the fabrication areas. Empty and non-empty containers within a given fabrication area are substantially evenly distributed between the stock areas within the fabrication area in order to reduce the total number of containers and the required sizes of the respective empty and non-empty container storage areas within the stock areas. Movements of empty and non-empty containers are accomplished such that empty and non-empty containers do not accumulate within a small portion of the total number of fabrication areas.

In a transfer of a work piece residing within a container from the first fabrication area to the second fabrication area through an air lock chamber, a first remote processor plans a first portion of the transfer operation involving transfer tools located within the first fabrication area, and a second remote processor plans a second portion of the transfer operation involving transfer tools located within the second fabrication area. The first remote processor selects a first stock area within the first fabrication area which functions as the source of the work-piece-containing container. The second remote processor selects a second stock area within the second fabrication area which functions as the final destination of the work-piece-containing container. The first remote processor directs the transport of the work-piece-containing container to the first stock area, and the second remote processor directs any required prepositioning of an empty container within the second fabrication area. Following completion of the transfer, the main processor updates one or more database entries associated with the work piece to indicate the container number containing the work piece and to indicate that the container is located within the second fabrication area.

BRIEF DESCRIPTION OF THE DRAWINGS

Other objects and advantages of the invention will become apparent upon reading the following detailed description and upon reference to the accompanying drawings in which.

Figure 1:
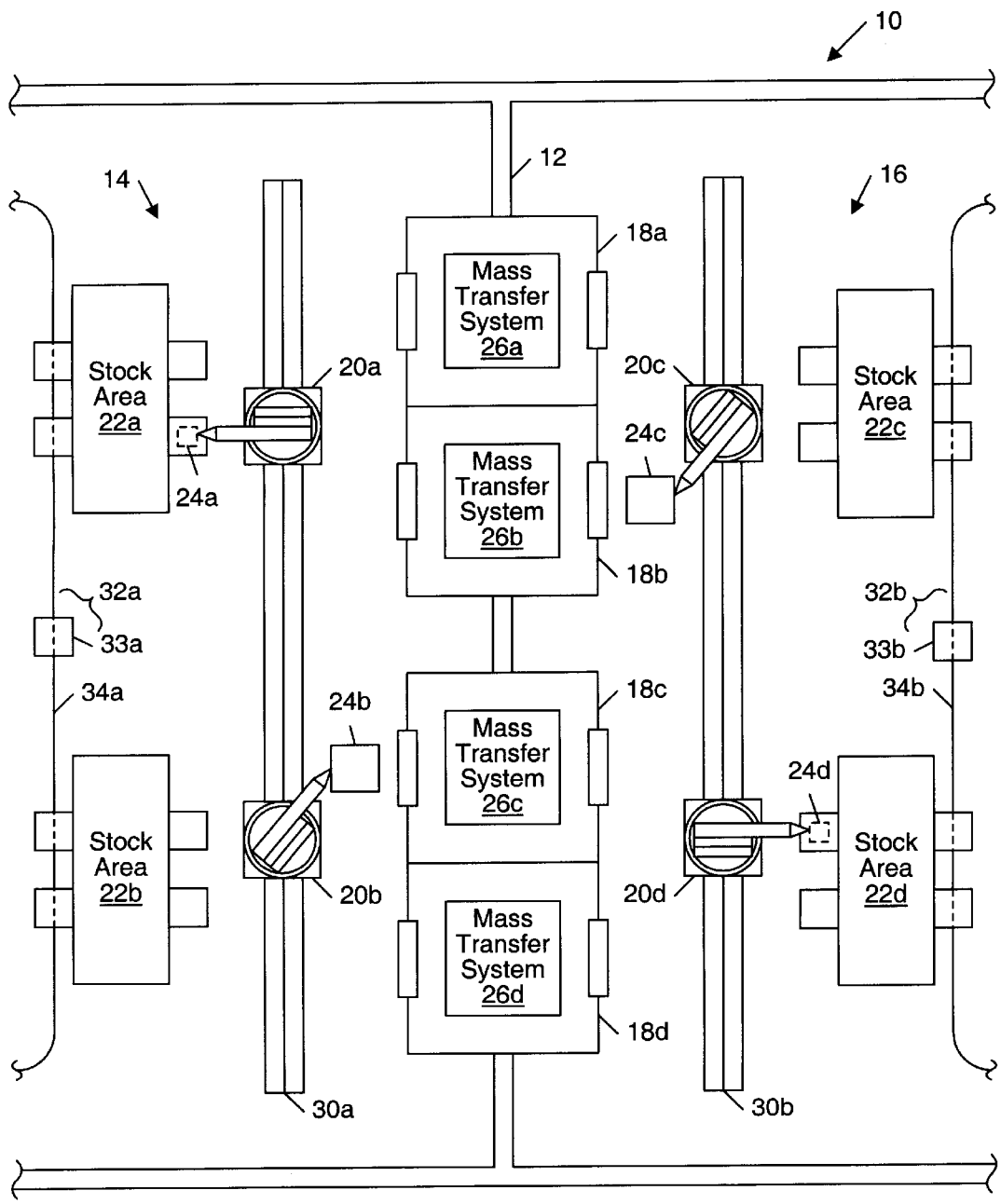
FIG. 1 is a top plan view of one embodiment of the automated material handling system of the present invention, wherein the embodiment shown is an automated wafer transfer system including four air lock chambers, four robotic arms, and four stock areas.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIG. 1 is a top plan view of one embodiment of an automated material handling system of the present invention. The embodiment shown is an automated wafer transfer system 10 employed in a wafer fabrication facility. Automated wafer transfer system 10 is used to perform containerless transfer of semiconductor wafers through a wall 12 between a first fabrication area 14 and a second fabrication area 16. First fabrication area 14 and second fabrication area 16 may have different contamination control requirements. First fabrication area 14 may be, for example, a photolithography processing area with stringent contamination control requirements, and second fabrication area 16 may be, for example, a chemical mechanical polish (CMP) processing area with much less stringent contamination control requirements. Advantages of performing wafer transfer operations automatically rather than manually include less variability in the amount of time required, less contamination introduced during the transfer operation, and less potential for wafer damage.

Figure 4:
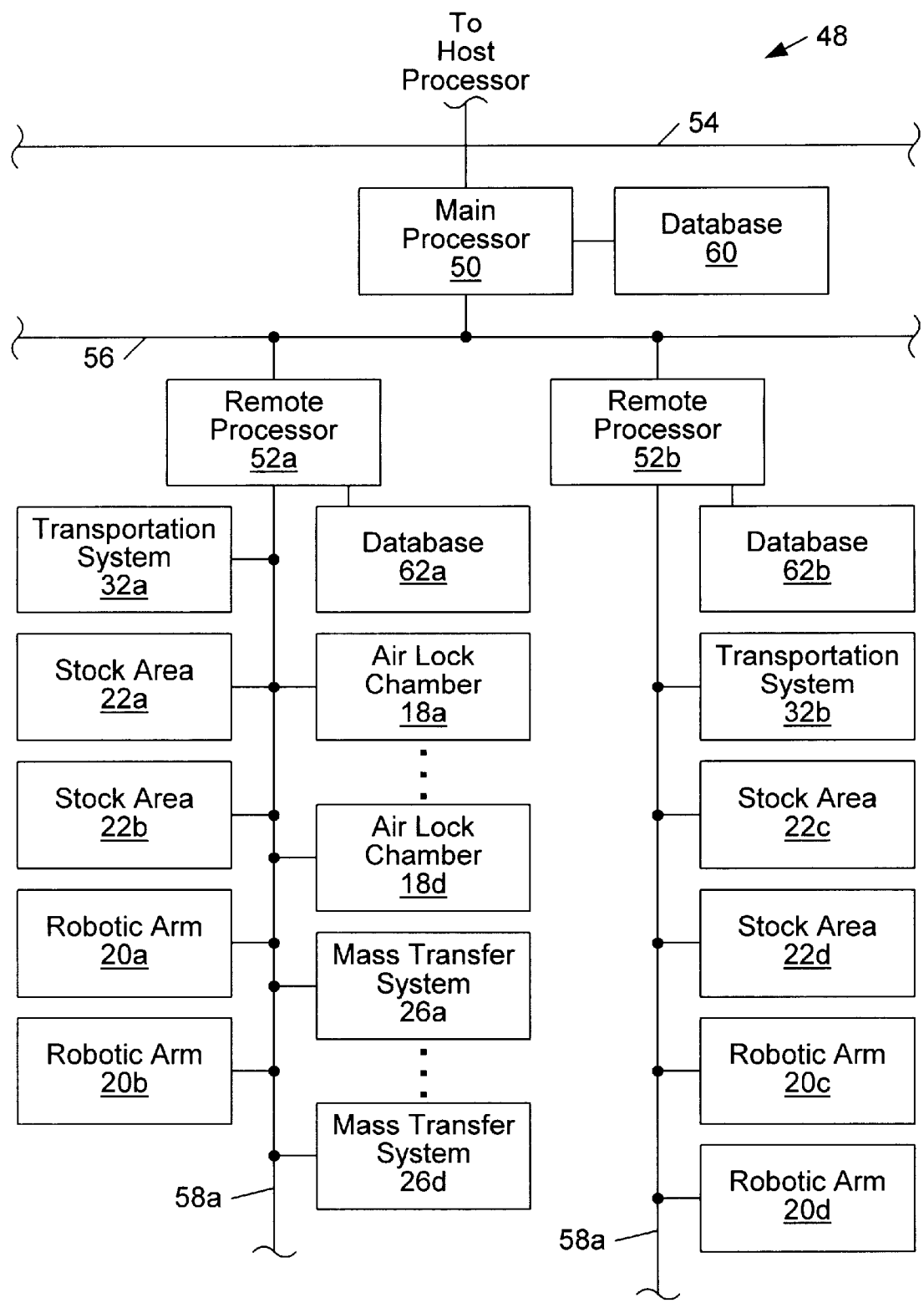
FIG. 4 is a block diagram of a preferred embodiment of a control system of the embodiment of FIG. 1.

Automated wafer transfer system 10 includes four air lock chambers 18a–d, four robotic arms 20a–d, four mass transfer systems 26a–d, four robotic arms 20a–d, four stock areas 22a–d, two transportation systems 32a–b, and a control system (see FIG. 4). Each air lock chamber 18 is positioned within a sealed opening in wall 12, and provides the ability to transfer semiconductor wafers between first fabrication area 14 and second fabrication area 16. Containers 24a–d (e.g., wafer boats) are associated with a given fabrication area and are used to transport semiconductor wafers within that fabrication area. Air lock chambers 18a–d include mass transfer systems 26a–d, respectively, which eliminate the need to transfer containers with the wafers. Containers 24a–d thus remain within their respective fabrication areas during wafer transfer operations, and any contaminants clinging to containers 24a–d are not transferred with the wafers from one fabrication area into the other. In addition, the air within each air lock chamber 18 is purged during wafer transfer operations, significantly reducing the number of airborne contaminants transferred from one fabrication area into the other. Thus during operation, each air lock chamber 18 provides a high level of isolation between first fabrication area 14 and second fabrication area 16.

Stock areas 22a–d are used to store containers. The containers may either be empty or contain wafers. Robotic arms 20a–d are positioned between air lock chambers 18a–d and stock areas 22a–d and are used to transfer containers between air lock chambers 18a–d and stock areas 22a–d. Robotic arms 20a–b preferably move along a first set of parallel rails 30a, and robotic arms 20c–d preferably move along a second set of parallel rails 30b.

Transportation system 32a is used to transport semiconductor wafers within first fabrication area 14. Transportation system 32a includes a transport car 33a. Transport car 33a delivers containers to stock areas 22a–b and receives containers from stock areas 22a–b. Transport car 33a is preferably mounted upon a first single rail 34a and moves along a closed path within first wafer fabrication area 14. Similar transportation system 32b exists within second fabrication area 16, and includes a transport car 33b. Transport car 33b preferably moves along a second single rail 34b. Transport car 33b delivers containers to stock areas 22c–d and receives containers from stock areas 22c–d.

Figure 2:
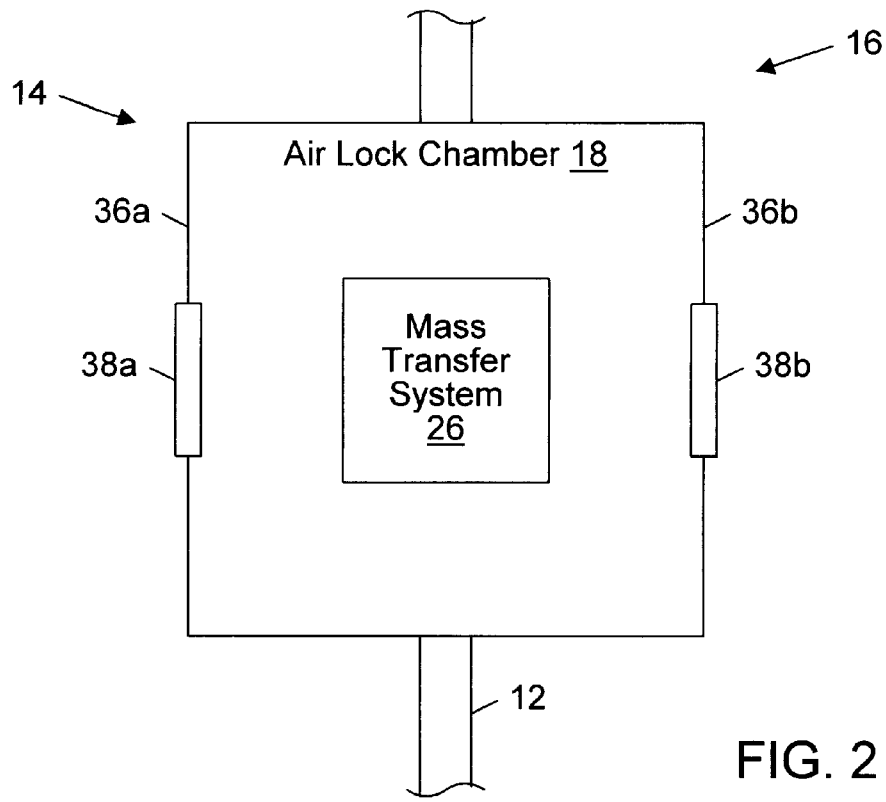
FIG. 2 is a top plan view of a preferred embodiment of each air lock chamber of FIG. 1.

FIG. 2 is a top plan view of a preferred embodiment of each air lock chamber 18. Each air lock chamber 18 has two opposed operational sides 36a–b. Operational side 36a is in first fabrication area 14 on one side of wall 12, and operational side 36b is in second fabrication area 16 on the other side of wall 12. A door 38a in operational side 36a allows access to the interior of air lock chamber 18 from first fabrication area 14, and a door 38b in operational side 36b allows access to the interior of air lock chamber 18 from second fabrication area 16.

Air lock chambers 18a–d contain respective mass transfer systems 26a–d. Each mass transfer system 26 provides an automated means of unloading semiconductor wafers from containers and loading semiconductor wafers into containers. Each mass transfer systems 26 includes a temporary storage location for storing semiconductor wafers inside the corresponding air lock chamber 18.

Figure 3:
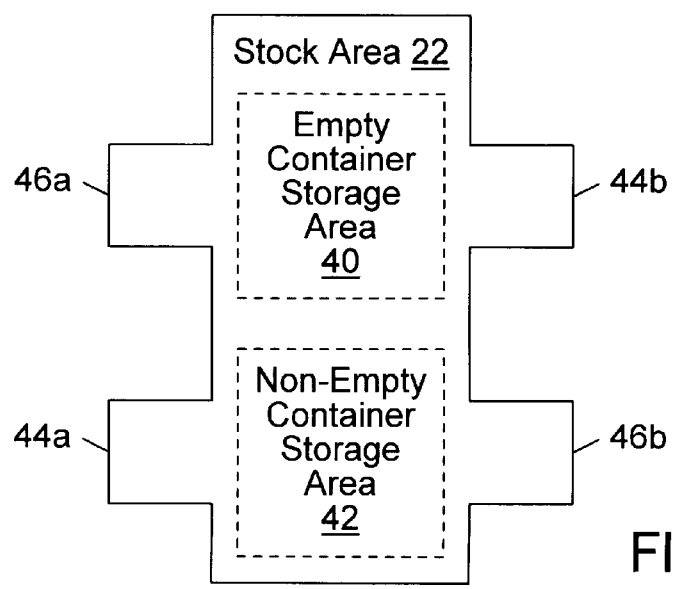
FIG. 3 is a top plan view of a preferred embodiment of each stock area of FIG. 1.

FIG. 3 is a top plan view of a preferred embodiment each stock area 22. Each stock area 22 includes an empty container storage area 40 and a non-empty container storage area 42. Each stock area 22 also has two input ports 44a–b and two output ports 46a–b on opposite sides. Each stock area 22 also includes a transport system which transfers containers between the ports (i.e., input ports 44a–b and output ports 46a–b) and the container storage areas (i.e., empty container storage area 40 and non-empty container storage area 42). Empty containers are stored in empty container storage area 40 and containers containing wafers are stored in non-empty container storage area 42. Containers are received by each stock area 22 at input ports 44a–b. Each input port 44 has a sensor which senses the presence or absence of one or more wafers within a received container. If the received container is empty, the container is stored within empty container storage area 40 via the transport system. If the received container contains one or more wafers, the received container is stored within non-empty storage area 42 via the transport system. Upon request, containers stored within each stock area 22 are provided at output ports 46a–b via the transport system.

FIG. 4 is a block diagram of a preferred embodiment of a control system 48 of automated wafer transfer system 10. Control system 48 governs the operations of the transfer tools of automated wafer transfer system 10. Control system 48 thus controls all movements of semiconductor wafers between first fabrication area 14 and second fabrication area 16. Control system 48 controls the operations of robotic arms 20a–d, air lock chambers 18a–d, mass transfer systems 26a–d, stock areas 22a–d, and transportation systems 32a–b, via control signals. Robotic arms 20a–d, air lock chambers 18a–d, mass transfer systems 26a–d, stock areas 22a–d, and transportation systems 32a–b regularly report their operational status to control system 48.

Control system 48 includes a main processor 50, two remote processors 52a–b, an internal network transmission medium 56, a first cell network transmission medium 58a, and a second cell network transmission medium 58b. Main processor 50 is coupled to an external network transmission medium 54. External network transmission medium 54 is used to convey signals. External network transmission medium 54 may be, for example, a multi-conductor cable, a coaxial cable, or a fiber-optic cable. External network transmission medium 54 is part of an external network. The external network may be, for example, a local area network (LAN) which implements the well known Ethernet communication protocol. A host processor is also coupled to external network transmission medium 54. The host processor communicates and main processor 50 communicate with one another via external network transmission medium 54.

Main processor 50 is also coupled to an internal network transmission medium 56. Internal network transmission medium 56 is used to convey signals, and may be, for example, a multi-conductor cable, a coaxial cable, or a fiber-optic cable. Internal network transmission medium 56 is part of an internal network including main processor 50 and remote processors 52a–b. The internal network may be, for example, a communication system which implements the well known SECS II communication protocol. Main processor 50 and remote processors 52a–b communicate with one another via external network transmission medium 54.

Transfer tools located within first fabrication area 14 are coupled to first cell network transmission medium 58a, including transportation system 32a, stock areas 22a–b, and robotic arms 20a–b. Similarly, transfer tools located within second fabrication area 16 are coupled to second cell network transmission medium 58b, including transportation system 32b, stock areas 22c–d, and robotic arms 20c–d. Air lock chambers 18a–d and corresponding mass transfer systems 26a–d are also coupled to first cell network transmission medium 58a. Cell network transmission media 58a–b are used to convey signals. Each cell network transmission medium 58 may be, for example, a multiconductor cable, a coaxial cable, or a fiber-optic cable. Each cell network transmission medium 58 is part of a cell network. Each cell network may, for example, use digital logic level signals to convey commands and status information. Remote processor 52a and transfer tools coupled to cell network transmission medium 58a communicate via cell network transmission medium 58a. Similarly, remote processor 52b and transfer tools coupled to cell network transmission medium 58b communicate via cell network transmission medium 58b.

Main processor 50 receives messages from the host computer via external network transmission medium 54. Such messages direct semiconductor wafer transfer operations. In response to messages from the host computer which direct wafer transfer operations, main processor 50 produces transfer commands, and transmits the transfer commands upon internal network transmission medium 56. Remote processors 52a–b receive the transfer commands, produce control signals in response thereto, and transmit the control signals upon respective cell network transmission media 58a–b. The transfer tools coupled to cell network transmission media 58a–b receive the control signals and perform predefined activities in response to (i.e., execute) the control signals. The end result of the coordinated activities of the transfer tools is a movement of one or more semiconductor wafers from one fabrication area to another.

A typical transfer command is a 'move request' command. Such a move request command identifies the work piece to be moved by identifying the container containing the work piece. The move request also specifies the final destination of the container (i.e., the work piece).

Main processor 50 also governs the dispersal of empty and non-empty containers within each fabrication area and among all of the fabrication areas. Empty and non-empty containers within a given fabrication area are substantially evenly distributed between the stock areas within the fabrication area in order to reduce the total number of containers and the required sizes of the respective empty and non-empty container storage areas within the stock areas. Movements of empty and non-empty containers are accomplished such that empty and non-empty containers do not accumulate within a small portion of the total number of fabrication areas.

Main processor 50 also maintains a database 60 which includes database entries for each wafer lot. A number is assigned to each wafer lot, and container database entries are associated with a wafer lot database entry indicting the container numbers of the one or more containers containing the wafers of the wafer lot. Each wafer-containing container has a location database entry indicating the fabrication area in which the container is currently located. Following the transfer of a wafer lot from one fabrication area to another, main processor 50 updates the associated container and location database entries. Remote processor 52a maintains a database 62 which includes the operational status of all transfer tools controlled by remote processor 52a (i.e., robotic arms 20a–b, air lock chambers 18a–d, mass transfer systems 26a–d, stock areas 22a–b, and transportation system 32a). Remote processor 52b maintains a database 62 which includes the operational status of all transfer tools controlled by remote processor 52b (i.e., robotic arms 20c–d, stock areas 22c–d, and transportation system 32b).

An example will now be used to describe the transfer of a group of semiconductor wafers, lot number 123, arranged within a single container identified as container number 456. Main processor 50 sends a transfer command to remote processors 52a–b directing the transfer of container 456, containing lot number 123, from first fabrication area 14 to second fabrication area 16. Remote processor 52a plans a first portion of the transfer operation involving the transfer tools located within first fabrication area 14, along with air lock chambers 18a–d and mass transfer systems 26a–d, and remote processor 52b plans a second portion of the transfer operation involving the transfer tools located within second fabrication area 16. During the planning of such wafer transfer operations, remote processors 52a–b take into consideration, for example, the distance associated with each possible route, the amount of time required to complete the transfer along each possible route, and the utilization history of each transfer tool which may be involved in the transfer. Weighing all such factors, remote processor 52a determines, for example, that stock area 22a, robotic arm 20a, and air lock chamber 18a with mass transfer system 26a will be involved in the transfer operation. Similarly, remote processor 52b determines, for example, that robotic arm 20c and stock area 22c will be involved in the transfer operation.

Stock area 22a is to be the source of container 456 containing lot number 123, and stock area 22c is to be the final destination of container 456. Doors 38*a–b* of air lock chamber 18*a* are both closed at the beginning of the transfer operation. Remote processor 52*a* issues a control signal to transportation system 32*a* directing the transport of container 456 to stock area 22*a*. Upon receipt of container 456 from transportation system 32*a* at an input port, stock area 22*a* notifies remote processor 52*a* and stores container 456 within non-empty storage area 42.

An empty container will be required to receive the wafers within second fabrication area 16. If stock area 22*c* does not contain an empty container, r emote processor 52*b* locates a suitable empty container within second fabrication area 16 and sends a control signal to transportation system 32*b* causing transportation system 32*b* to deliver the empty container to stock area 22*c*. Upon receipt of the empty container from transportation system 32*b* at an input port, stock area 22*c* notifies remote processor 52*b* and stores the empty container within empty container storage area 40. Assume the empty container is number 789.

Once stock area 22*a* has received container 456, remote processor 52*a* issues a control signal to stock area 22*a* which causes stock area 22*a* to provide container 456 at an output port on a side of stock area 22*a* closest to robotic arm 20*a*. Remote processor 52*a* sends a control signal to robotic arm 20*a* which causes robotic arm 20*a* to pick up container 456 and place it within mass transfer system 26*a* of air lock chamber 18*a*. Remote processor 52*a* simultaneously sends a control signal to air lock chamber 18*a* which causes air lock chamber 18*a* to open door 38*a* in operational side 36*a*, allowing access to the interior of air lock chamber 18*a* from first fabrication area 14. Once robotic arm 20*a* has placed the wafer-containing container within mass transfer system 26*a*, mass transfer system 26*a* removes the wafers from container 456 and places the wafers within the temporary storage location. Remote processor 52*a* then sends a control signals to robotic arm 20*a* which causes robotic arm 20*a* to remove container 456, now empty, from air lock chamber 18*a*, and air lock chamber 18*a* closes door 38*a* in response to a control signal from remote processor 52*a*. Robotic arm 20*a* delivers empty container 456 to an input port of stock area 22*a* closest to robotic arm 20*a*. Stock area 22*a* stores empty container 456 within empty container storage area 40. Remote processor 52*a* reports completion of the first portion of the transfer operation to main processor 50.

At this time doors 38*a–b* of air lock chamber 18*a* are both in the closed position. A period of time is allowed to elapse during which all of the air present within air lock chamber 18*a* is exhausted and replaced by filtered air provided, for example, through the upper surface of air lock chamber 18*a*. This purging step helps prevent any airborne contaminants introduced into air lock chamber 18*a* from first fabrication area 14 when door 38*a* was open from being transferred to second fabrication area 16 when door 38*b* is subsequently opened.

During the time the air within air lock chamber 18*a* is being purged, main processor 50 sends a transfer command to remote processor 52*b* which initiates the second portion of the transfer operation. Remote processor 52*b* sends a control signal to stock area 22*c* causing stock area 22*c* to provide empty container 789 at an output port on a side of stock area 22*c* closest to robotic arm 20*c*. Remote processor 52*b* then sends a control signal to robotic arm 20*c* which causes robotic arm 20*c* to pick up empty container 789 and place it within mass transfer system 26*a* of air lock chamber 18*a*. Remote processor 52*a* simultaneously sends a control signals to air lock chamber 18*a* causing air lock chamber 18*a* to open door 38*b* in operational side 36*b*, allowing access to the interior of air lock chamber 18*a* from second fabrication area 16. Once robotic arm 20*c* has placed empty container 789 within mass transfer system 26*a*, mass transfer system 26*a* removes the wafers from the temporary storage location and places the wafers within container 789. Remote processor 52*b* then sends a control signal to robotic arm 20*c* causing robotic arm 20*c* to remove container 789, now containing the wafers, from air lock chamber 18*a*, and door 38*b* is closed. Remote processor 52*b* then sends a control signal to robotic arm 20*c* causing robotic arm 20*c* to deliver container 789, containing lot number 123, to an input port of stock area 22*c* closest to robotic arm 20*c*. Stock area 22*c* stores the wafer-containing container within non-empty storage area 42.

At this time remote processor 52*b* reports completion of the second portion of the transfer operation to main processor 50. Main processor 50 updates database 60 in light of the completed transfer operation. The container and location database entries associated with lot number 123 are updated to reflect that container 789 now contains wafer lot 123, and that container 789 is currently located in second fabrication area 16.

It is noted that four air lock chambers 18*a–d* are available for wafer transfer operations. Control system 48 is capable of controlling wafer transfer operations involving multiple air lock chambers in order to improve the number of wafers transferred in a given period of time (i.e., wafer transfer throughput). For example, multiple containers may be transferred from first fabrication area 14 to second fabrication area 16 using stock areas 22*a* and 22*c*, robotic arms 20*a* and 20*c*, and air lock chambers 18*a* and 18*b* with respective mass transfer systems 26*a* and 26*b*. Following transfer of wafers within a first wafer-containing container to mass transfer system 26*a* of air lock chamber 18*a*, robotic arm 20*a* may place a second wafer-containing container within mass transfer system 26*b* of air lock chamber 18*b* while the air within air lock chamber 18*a* is being purged. As a result, the number of wafers transferred in a given amount of time is increased. Additional wafer transfer tools (i.e., stock areas 22*b* and 22*d*, robotic arms 20*b* and 20*d*, and air lock chambers 18*b* and 18*d* with respective mass transfer systems 26*b* and 26*d*) may also be employed in order to increase wafer transfer throughput.

Control system 48 is also capable of carrying out wafer transfer operations in "degraded" modes when one or more of the wafer transfer tools are inoperative. For example, if robotic arm 20*a* is inoperative, remote processor 52*a* may direct robotic arm 20*b* to accomplish all container transfers between stock areas 22*a–b* and air lock chambers 18*a–d*. If robotic arms 20*a–b* are both inoperative, remote processor 52*a* is able to coordinate wafer transfer operations involving the manual transfer of wafers between stock areas 22*a–b* and air lock chambers 18*a–18d*.

It will be appreciated by those skilled in the art having the benefit of this disclosure that this invention is believed to be an automated material handling system for a manufacturing facility divided into separate fabrication areas. The automated material handling system plans and carries out the movement of work pieces between fabrication areas and maintains a database indicating the location of the work pieces within the manufacturing facility. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A material handling system, comprising:
 a main processor configured to produce a transfer command, wherein the transfer command directs the movement of a work piece from a first fabrication area to a second fabrication area;
 a remote processor coupled to receive the transfer command and configured to respond to the transfer command by: (i) selecting a target transfer tool from among a plurality of transfer tools, and (ii) producing a control signal directed to the target transfer tool; and
 wherein the target transfer tool is coupled to receive the control signal and configured to execute the control signal.

2. The material handling system as recited in claim 1, wherein the work piece comprises a semiconductor wafer.

3. The material handling system as recited in claim 1, wherein the transfer command identifies the work piece.

4. The material handling system as recited in claim 1, wherein the target transfer tool is a stock area within the first fabrication area which is to serve as a source of the work piece.

5. The material handling system as recited in claim 1, wherein the target transfer tool is a stock area within the second fabrication area which is to serve as a final destination for the work piece.

6. The material handling system as recited in claim 1, wherein the plurality of transfer tools includes a transportation system, a stock area, a robotic arm, an air lock chamber, and a mass transfer system.

7. The material handling system as recited in claim 1, further comprising an internal network transmission medium, wherein internal network transmission medium is used to convey electrical signals, and wherein the main processor and the remote processor are coupled to the internal network transmission medium and communicate via the internal network transmission medium.

8. The material handling system as recited in claim 7, wherein the internal network transmission medium is selected from the group consisting of a multi-conductor cable, a coaxial cable, and a fiber-optic cable.

9. The material handling system as recited in claim 1, further comprising a cell network transmission medium, wherein the cell network transmission medium is used to convey electrical signals, and wherein the remote processor and the target transfer tool are coupled to the cell network transmission medium and communicate via the cell network transmission medium.

10. The material handling system as recited in claim 9, wherein the network transmission medium is selected from the group consisting of a multi-conductor cable, a coaxial cable, and a fiber-optic cable.

11. A material handling system, comprising:
 a main processor configured to produce a transfer command, wherein the transfer command directs the movement of a work piece from a first fabrication area to a second fabrication area;
 a first remote processor coupled to receive the transfer command and configured to produce a first control signal in response to the transfer command;
 a second remote processor coupled to receive the transfer command and configured to produce a second control signal in response to the transfer command;
 a first transfer tool coupled to receive the first control signal and configured to execute the first control signal; and
 a second transfer tool coupled to receive the second control signal and configured to execute the second control signal.

12. The material handling system as recited in claim 11, wherein the first transfer tool is located within the first fabrication area and selected from the group consisting of a transportation system, a stock area, and a robotic arm.

13. The material handling system as recited in claim 11, wherein the second transfer tool is located within the second fabrication area and selected from the group consisting of a transportation system, a stock area, and a robotic arm.

14. A material handling system, comprising:
 an internal network transmission medium for conveying communication signals;
 a main processor coupled to the internal network transmission medium and configured to produce a transfer command upon the internal network transmission medium, wherein the transfer command directs the movement of a work piece from a first fabrication area to a second fabrication area;
 a cell network transmission medium for conveying control signals;
 a remote processor coupled between the internal and cell network transmission media, wherein the remote processor is configured to receive the transfer command and to produce a control signal upon the cell network transmission medium in response to the transfer command; and
 a transfer tool coupled to the cell network transmission medium, wherein the transfer tool is configured to receive and execute the control signal.

15. The material handling system as recited in claim 14, wherein the transfer tool is selected from the group consisting of a transportation system, a stock area, a robotic arm, an air lock chamber, and a mass transfer system.

16. A material handling system, comprising:
 a main processor configured to produce a transfer command, wherein the transfer command directs the movement of a work piece from a first fabrication area to a second fabrication area, wherein the first fabrication area is isolated from the second fabrication area by an airlock chamber;
 a remote processor coupled to receive the transfer command and configured to produce a control signal in response to the transfer command; and
 a transfer tool coupled to receive the control signal and configured to execute the control signal.

17. The material handling system as recited in claim 16, wherein the work piece comprises a semiconductor wafer.

18. The material handling system as recited in claim 16, wherein the transfer command identifies the work piece.

19. The material handling system as recited in claim 16, wherein the remote processor selects a stock area within the first fabrication area which is to serve as a source of the work piece.

20. The material handling system as recited in claim 16, wherein the remote processor selects a stock area within the second fabrication area which is to serve as a final destination for the work piece.

21. The material handling system as recited in claim 16, wherein the transfer tool is selected from the group consisting of a transportation system, a stock area, a robotic arm, an air lock chamber, and a mass transfer system.

22. The material handling system as recited in claim 16, further comprising an internal network transmission medium, wherein internal network transmission medium is used to convey electrical signals, and wherein the main processor and the remote processor are coupled to the internal network transmission medium and communicate via the internal network transmission medium.

23. The material handling system as recited in claim 22, wherein the internal network transmission medium is selected from the group consisting of a multi-conductor cable, a coaxial cable, and a fiber-optic cable.

24. The material handling system as recited in claim 16, further comprising a cell network transmission medium, wherein the cell network transmission medium is used to convey electrical signals, and wherein the remote processor and the transfer tool are coupled to the cell network transmission medium and communicate via the cell network transmission medium.

25. The material handling system as recited in claim 24, wherein the network transmission medium is selected from the group consisting of a multi-conductor cable, a coaxial cable, and a fiber-optic cable.

26. A material handling system, comprising:
   a main processor configured to produce a transfer command, wherein the transfer command directs the movement of a work piece from a first fabrication area to a second fabrication area;
   a remote processor coupled to receive the transfer command and configured to produce a control signal in response to the transfer command;
   a transfer tool coupled to receive the control signal and configured to execute the
   control signal; and
   an internal network transmission medium, wherein the internal network transmission medium is used to convey electrical signals, and wherein the main processor and the remote processor are coupled to the internal network transmission medium and communicate via the internal network transmission medium.

27. The material handling system as recited in claim 26, wherein the work piece comprises a semiconductor wafer.

28. The material handling system as recited in claim 26, wherein the transfer command identifies the work piece.

29. The material handling system as recited in claim 26, wherein the remote processor selects a stock area within the first fabrication area which is to serve as a source of the work piece.

30. The material handling system as recited in claim 26, wherein the remote processor selects a stock area within the second fabrication area which is to serve as a final destination for the work piece.

31. The material handling system as recited in claim 26, wherein the transfer tool is selected from the group consisting of a transportation system, a stock area, a robotic arm, an air lock chamber, and a mass transfer system.

32. The material handling system as recited in claim 26, wherein the internal network transmission medium is selected from the group consisting of a multi-conductor cable, a coaxial cable, and a fiber-optic cable.

33. The material handling system as recited in claim 26, further comprising a cell network transmission medium, wherein the cell network transmission medium is used to convey electrical signals, and wherein the remote processor and the transfer tool are coupled to the cell network transmission medium and communicate via the cell network transmission medium.

34. The material handling system as recited in claim 33, wherein the cell network transmission medium is selected from the group consisting of a multi-conductor cable, a coaxial cable, and a fiber-optic cable.

35. A material handling system, comprising:
   a main processor configured to produce a transfer command, wherein the transfer command directs the movement of a work piece from a first fabrication area to a second fabrication area;
   a remote processor coupled to receive the transfer command and configured to produce a control signal in response to the transfer command;
   a transfer tool coupled to receive the control signal and configured to execute the control signal; and
   a cell network transmission medium, wherein the cell network transmission medium is used to convey electrical signals, and wherein the remote processor and the transfer tool are coupled to the cell network transmission medium and communicate via the cell network transmission medium.

36. The material handling system as recited in claim 35, wherein the work piece comprises a semiconductor wafer.

37. The material handling system as recited in claim 35, wherein the transfer command identifies the work piece.

38. The material handling system as recited in claim 35, wherein the remote processor selects a stock area within the first fabrication area which is to serve as a source of the work piece.

39. The material handling system as recited in claim 35, wherein the remote processor selects a stock area within the second fabrication area which is to serve as a final destination for the work piece.

40. The material handling system as recited in claim 35, wherein the transfer tool is selected from the group consisting of a transportation system, a stock area, a robotic arm, an air lock chamber, and a mass transfer system.

41. The material handling system as recited in claim 35, further comprising an internal network transmission medium, wherein internal network transmission medium is used to convey electrical signals, and wherein the main processor and the remote processor are coupled to the internal network transmission medium and communicate via the internal network transmission medium.

42. The material handling system as recited in claim 41, wherein the internal network transmission medium is selected from the group consisting of a multi-conductor cable, a coaxial cable, and a fiber-optic cable.

43. The material handling system as recited in claim 35, wherein the cell network transmission medium is selected from the group consisting of a multi-conductor cable, a coaxial cable, and a fiber-optic cable.

* * * * *